(12) United States Patent
Lev et al.

(10) Patent No.: US 8,944,424 B2
(45) Date of Patent: Feb. 3, 2015

(54) CARBON FIBER CLAMPING APPARATUS AND METHOD

(75) Inventors: Jeffrey A Lev, Tomball, TX (US); Mark S Tracy, Tomball, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 802 days.

(21) Appl. No.: 13/129,120

(22) PCT Filed: Nov. 21, 2008

(86) PCT No.: PCT/US2008/084424
§ 371 (c)(1),
(2), (4) Date: May 12, 2011

(87) PCT Pub. No.: WO2010/059164
PCT Pub. Date: May 27, 2010

(65) Prior Publication Data
US 2011/0221114 A1  Sep. 15, 2011

(51) Int. Cl.
*B25B 1/00* (2006.01)
*H05K 7/12* (2006.01)

(52) U.S. Cl.
CPC .......................... *H05K 7/12* (2013.01)
USPC ................... 269/86; 269/166; 269/97

(58) Field of Classification Search
USPC ............ 269/3, 6, 143, 249, 95, 111, 97, 54.1, 269/54.5, 166–167, 86, 91; 403/252
See application file for complete search history.

(56) References Cited

U.S. PATENT DOCUMENTS

| | | | |
|---|---|---|---|
| 2,464,375 A | * | 3/1949 | Clark .................................. 81/6 |
| 2,886,080 A | * | 5/1959 | Rappeport ................... 269/87.3 |
| 4,824,066 A | * | 4/1989 | Smith ........................... 248/500 |
| 5,048,807 A | * | 9/1991 | Martinez et al. ............... 269/243 |
| 5,363,976 A | * | 11/1994 | Kapka ............................ 220/3.8 |
| 5,740,019 A | | 4/1998 | Lee |
| 5,797,695 A | * | 8/1998 | Prusmack ..................... 403/170 |
| 5,933,325 A | | 8/1999 | Hou |
| 6,222,734 B1 | | 4/2001 | Bookhardt et al. |

(Continued)

FOREIGN PATENT DOCUMENTS

| | | |
|---|---|---|
| JP | 07-176874 | 7/1995 |
| JP | 08-139437 | 5/1996 |
| JP | 2004-095976 | 3/2004 |

OTHER PUBLICATIONS

WIPO, International Search Report, Apr. 30, 2009, PCT/US2008/084424, International Filing Date, Nov. 21, 2008.

*Primary Examiner* — Lee D Wilson
*Assistant Examiner* — Henry Hong
(74) *Attorney, Agent, or Firm* — Hewlett-Packard Patent Development

(57) ABSTRACT

Clamping apparatus and methods are provided. The apparatus can include a rigid backing member having a plurality of apertures disposed therethrough. The apparatus can further include a spring member having a plurality of radial members each having a first end and a second end. The first end of the radial members can be connected at a hub. The second end of each radial member can be connected to a flange. A plurality of apertures, corresponding to the plurality of apertures in the backing member, can be disposed about the flange. The radial members can be fabricated using two or more plies of resin-impregnated carbon fiber. The spring member can be affixed to the backing member using one or more fasteners disposed in the backing member apertures and corresponding aperture disposed in the flange.

17 Claims, 4 Drawing Sheets

(56) References Cited

U.S. PATENT DOCUMENTS

| | | |
|---|---|---|
| 6,508,300 B1 | 1/2003 | Hegde |
| 6,644,387 B1 | 11/2003 | Lee et al. |
| 6,731,504 B1 | 5/2004 | Liu |
| 6,977,816 B2 | 12/2005 | Lee et al. |
| 7,021,615 B2 * | 4/2006 | Kuroda .................. 269/309 |
| 7,072,184 B2 | 7/2006 | Kalyandurg |
| 7,102,889 B1 | 9/2006 | Barsun |
| 7,193,854 B2 | 3/2007 | Bonomo et al. |
| 7,262,969 B2 | 8/2007 | Lee et al. |
| 7,286,371 B2 | 10/2007 | Unrein |
| 7,327,577 B2 | 2/2008 | Gilliland et al. |
| 7,342,795 B2 | 3/2008 | Lee et al. |
| 7,405,938 B2 | 7/2008 | Yang |
| 7,839,345 B2 * | 11/2010 | Kubacki et al. ............. 343/715 |
| 2007/0022707 A1 * | 2/2007 | Gregg et al. ............. 52/735.1 |

* cited by examiner

CARBON FIBER CLAMPING APPARATUS AND METHOD

BACKGROUND OF THE INVENTION

1. Field of the Invention

Embodiments of the present invention generally relate to mounting electronic components on a printed circuit board. More particularly, embodiments of the present invention relate to a carbon fiber clamping apparatus for mounting electronic components on a printed circuit board.

2. Description of the Related Art

The use of socket-mount devices is ubiquitous in most electronic devices. Establishing proper initial and long-term seating of socket-mount devices is essential for reliable operation of many IC or "chip" containing electronic devices. Clamps are often used to ensure proper initial and long-term seating of socket-mount devices. However, given the wide variety, size, shape, and pin count of currently available and future socket-mount devices, the weight and complexity of existing clamping structures continues to increase, in marked contrast to consumer demand for lighter and smaller electronic devices.

SUMMARY OF THE INVENTION

A clamping apparatus is provided. The apparatus can include a rigid backing member having a plurality of apertures disposed therethrough. The apparatus can further include a spring member having a plurality of radial members each having a first end and a second end. The first end of each radial member can be connected at a hub. The second end of each radial member can be connected to a flange. A plurality of apertures, corresponding to the plurality of apertures in the backing member, can be disposed about the flange. The radial members can be fabricated using two or more plies of resin-impregnated carbon fiber. The spring member can be affixed to the backing member using one or more fasteners disposed in the backing member apertures and corresponding aperture disposed in the flange.

A method of clamping one or more socket-mount devices is also provided. One or more socket-mount devices can be disposed on a first side of a board. A spring member can be disposed proximate the first side of the board. A pressure member, having a first end and a second end can be disposed with the first end proximate one or more hubs. The second end of the pressure member can be disposed proximate at least one of the one or more socket-mount devices. A backing member can be disposed on a second side of the circuit board, opposite the spring member. The backing member can have a plurality of apertures therethrough. At least a portion of the apertures on the backing member can be aligned with at least a portion of the apertures on the flange. The spring member can be affixed to the backing member using one or more fasteners disposed in one or more corresponding apertures between the backing member and the flange. Installation of the one or more fasteners can place all or a portion of the spring member in tension, thereby applying pressure via the pressure member to the socket-mount device.

BRIEF DESCRIPTION OF THE DRAWINGS

Advantages of one or more disclosed embodiments may become apparent upon reading the following detailed description and upon reference to the drawings in which.

DETAILED DESCRIPTION

Figure 1:
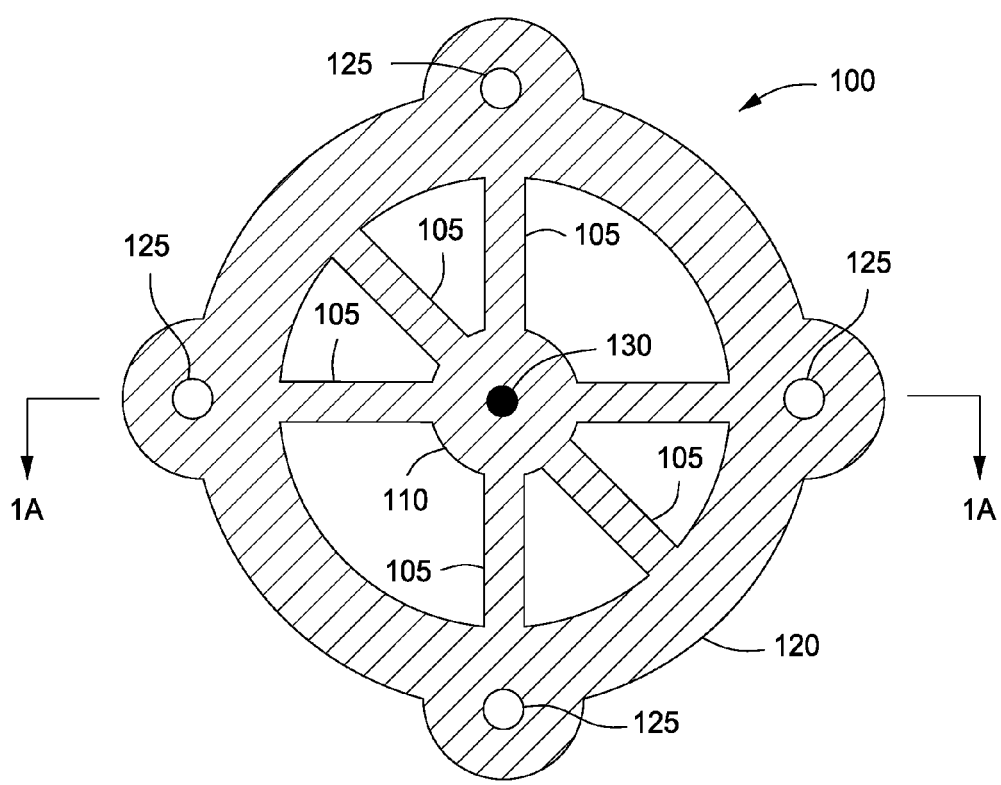
FIG. 1 depicts a plan view of an illustrative spring member, according to one or more embodiments described herein.
Figure 1A:
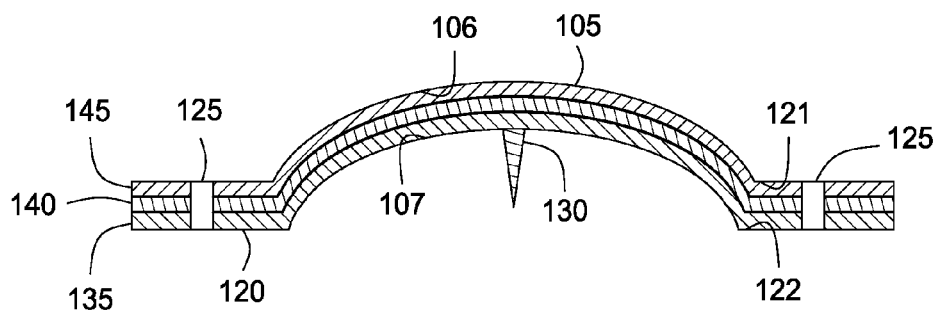
FIG. 1A depicts a cross-sectional view of the illustrative spring member depicted in FIG. 1 along line 1A-1A, according to one or more embodiments described herein.

FIG. 1 depicts a plan view of an illustrative spring member 100, according to one or more embodiments. FIG. 1A depicts a cross-sectional view of the illustrative spring member 100 depicted in FIG. 1 along line 1A-1A, according to one or more embodiments. One or more features hidden or otherwise obstructed in the plan view depicted in FIG. 1 are more clearly depicted in the cross-sectional elevation depicted in FIG. 1A. In one or more embodiments, the spring member 100 can include a plurality of radial members 105 (a total of six (6) radial members 105 are depicted in FIG. 1) connecting one or more hubs 110 and one or more one or more flanges 120. The one or more flanges 120 can have one or more apertures 125 disposed therethrough. One or more pressure members 130 can be disposed in, on, or about the one or more hubs 110.

Each of the radial members 105 can have any shape, size, geometry, and/or cross-section providing a first end and a second end. Each of the radial members 105 can be a solid member, a hollow member, or any combination or mixture of hollow and/or solid members. In one or more specific embodiments, the plurality of radial members 105 can have a solid rectangular cross section with the larger flat sides of the rectangle forming an upper surface 106 and a lower surface 107 on each of the radial members 105. In one or more embodiments, the spring member 100 can include two or more radial members 105; four or more radial members 105; six or more radial members 105; or eight or more radial members 105. The angle between the longitudinal centerlines of each of the radial members 105 measured at the one or more hubs 110 can be the same or different. In one or more embodiments, the intervening or intermediate angle between the longitudinal centerlines of each of the radial members 105 measured at the one or more hubs 110 can be about 15° or more; about 30° or more; about 45° or more; about 60° or more; about 75° or more; or about 90° or more.

As used herein, the terms "upper," "lower," "upward," "downward," and the like refer to the relative position of a first component with respect to the relative position of a second component and are not intended to denote a particular geometry, position, or spatial orientation.

In one or more embodiments, the first end of at least two of the radial members 105 can be attached, bonded, integrally formed, or any combination thereof, to the one or more hubs 110. In one or more embodiments, the second end of at least two of the radial members 105 can be attached, bonded, or integrally formed with the flange 120. In one or more embodiments, the radial members 105 can provide a downward force, biasing the hub 110 towards the flange 120. In one or more embodiments, the plurality of radial members 105 can provide a downward force biasing the hub 110 towards the flange 120 of from about 0.05 lb$_f$ to about 5 lb$_f$; 0.1 lb$_f$ to about 3 lb$_f$; or 0.15 lb$_f$ to about 2 lb$_f$.

The one or more hubs 110 can be partially or completely independent of the plurality of radial members 105. In one or more embodiments, the one or more hubs 110 can be a planar or semi-planar member having at least a first ("upper") surface and a second ("lower") surface. In one or more embodiments, the one or more hubs 110 can be a single-piece or a multi-piece member. In one or more embodiments, the one or more hubs 110 can be permanently or temporarily attached or otherwise affixed to at least one of the radial members 105. In one or more embodiments, the one or more hubs 110 can be permanently attached or otherwise affixed to at least one of the radial members 105 using one or more adhesives, for example one or more thermosetting epoxy adhesives. In one or more embodiments, the one or more hubs 110 can be permanently attached or otherwise affixed to at least one of the radial members 105 through welding, soldering, or the like. In one or more embodiments, the one or more hubs 110 can be detachably attached to at least one of the radial members 105 using one or more mechanical fasteners, for example one or more rivets, screws, or the like.

In one or more embodiments, all or a portion of the hub 110 can be integrally fabricated, permanently joined, or otherwise unified with the first end of at least one of the plurality of radial members 105. In one or more embodiments, all or a portion of the hub 110 can be integrally cast or forged with the first end of at least one of the plurality of radial members 105. In one or more embodiments, all or a portion of the hub 110 can be a laminated structure integrally shaped, laid, or molded with the first end of at least one of the plurality of radial members 105.

In one or more embodiments, the one or more pressure members 130 can have a first ("upper") end and a second ("lower") end. Each pressure member 130 can be manufactured or otherwise fabricated using one or more incompressible materials. The upper end of the one or more pressure members 130 can be disposed proximate the lower surface of the one or more hubs 110. In one or more embodiments, the one or more pressure members 130 can be independent of the one or more hubs 110. In one or more embodiments, the one or more pressure members 130 can be permanently or temporarily attached or otherwise affixed to the one or more hubs 110. In one or more embodiments, the one or more pressure members 130 can be permanently attached or otherwise affixed to the one or more hubs 110 using one or more adhesives, for example one or more thermosetting epoxy based adhesives. In one or more embodiments, the one or more pressure members 130 can be permanently attached or otherwise affixed to the one or more hubs 110 by welding, soldering, or the like. In one or more embodiments, the one or more pressure members 130 can be detachably attached to the one or more hubs 110 using one or more mechanical fasteners, for example one or more rivets, screws, or the like.

In one or more embodiments, all or a portion of the one or more pressure members 130 can be integrally fabricated, permanently joined, or otherwise unified with at least a portion of the one or more hubs 110. In one or more embodiments, the one or more pressure members 130 can be integrally cast or forged as a portion of the one or more hubs 110. In one or more embodiments, the or more pressure members 130 can be a laminated structure integrally shaped, laid, or molded with at least a portion of the one or more hubs 110.

The force exerted by the plurality of radial members 105 on the one or more hubs 110 can be transmitted from the one or more hubs 110 to the first end of the pressure member 130. Since the pressure member 130 is formed from an incompressible material, any pressure applied to the first end of the pressure member 130 can be transmitted to the second end of the pressure member 130. Since the pressure applied at the first end of the pressure member 130 can be transmitted via the pressure member to the second end, the geometry of the pressure member 130 can affect the pressure exerted at the second end of the pressure member 130.

By way of non-limiting example, a plurality of radial members 105 exerting a force of 3 lb$_f$ on a single pressure member 130 having a first end cross sectional area of 2 in$^2$ would provide a pressure of approximately 1.5 lb$_f$/in$^2$ at the first end of the pressure member 130. If the cross-sectional area of the second end of the pressure member 130 is less than the cross-sectional area of the first end of the pressure member 130, the pressure exerted at the second end of the pressure member 130 will be greater than pressure applied to the first end of the pressure member 130. For example, using the aforementioned loading, if the cross sectional area of the second end of the pressure member 130 is 1 in$^2$, the pressure exerted by the second end of the pressure member 130 would be 3 lb$_f$/in$^2$. The second end of the pressure member 130 can have any physical configuration, for example a pinpoint second end, a radiused second end, and/or a flat second end. The various second end configurations can be selected, adjusted or altered to provide any desired loading at the second end of the pressure member 130.

Conversely, if the cross-sectional area of the second end of the pressure member 130 is greater than the cross-sectional area of the first end of the pressure member 130, the pressure exerted at the second end of the pressure member 130 will be less than the pressure applied to the first end of the pressure member 130. For instance, using the same data as the previous example, if the cross sectional area of the second end of the pressure member 130 is 4 in$^2$, the pressure exerted by the second end of the pressure member 130 would be 0.75 lb$_f$/in$^2$. Thus, the geometry of the pressure member 130 can be adjusted to provide virtually any desired pressure at the second end of the pressure member 130 by effecting changes in the cross sectional area of the second end of the pressure member 130.

In one or more embodiments, the flange 120 can be a planar or semi-planar member having at least a first ("upper") surface 121 and a second ("lower") surface 122. In one or more embodiments, the flange 120 can be a single-piece or a multi-piece member. In one or more specific embodiments, the flange 120 can be a discontinuous, multi-piece, member containing a plurality of independent segments. In one or more specific embodiments, as depicted in FIGS. 1 and 1A, the flange 120 can be a single, annular, member having an inner and an outer perimeter forming a planar surface therebetween.

In one or more embodiments, one or more apertures 125 can be evenly or unevenly disposed in, on, or about the flange 120. In one or more embodiments, the one or more apertures 125 can extend from the first surface 121 to the second surface 122 of the flange 120. Each of the one or more apertures 125 can have a constant or variable diameter. Each of the one or more apertures 125 can have the same or different diameters. In one or more embodiments, 2 or more apertures; 4 or more apertures; 6 or more apertures; or 8 or more apertures 125 can be disposed in, on, or about the flange 120. In one or more embodiments, the diameter of the one or more apertures 125 can have a diameter of from about 0.5 mm to about 10 mm;

from about 1 mm to about 8 mm; or from about 1 mm to about 5 mm. In one or more specific embodiments, four (4) apertures, each having a diameter of from about 1 mm to about 3 mm, can be disposed evenly in, on, or about the flange 120.

In one or more embodiments, the flange 120 can be partially or completely independent of the plurality of radial members 105. In one or more embodiments, the flange 120 can be fabricated independent of the plurality of radial members 105, and permanently or temporarily attached to all or a portion of the second end of one or more of the radial members 105. In one or more embodiments, the flange 120 can be permanently attached or otherwise affixed to one or more of the radial members 105 using one or more adhesives, for example one or more thermosetting epoxy adhesives. In one or more embodiments, the flange 120 can be permanently attached or otherwise affixed to at least one of the radial members 105 through welding, soldering, or the like. In one or more embodiments, the one or more hubs 110 can be detachably attached to at least one of the radial members 105 using one or more mechanical fasteners, for example one or more rivets, screws, or the like.

In one or more embodiments, all or a portion of the flange 120 can be integrally fabricated, permanently joined, or otherwise unified with all or a portion of the second end of at least one of the plurality of radial members 105. In one or more embodiments, all or a portion of the flange 120 can be integrally cast or forged with all or a portion of the second end of at least one of the plurality of radial members 105. In one or more embodiments, all or a portion of the flange 120 can be a laminated structure integrally shaped, laid, or molded with at least a portion of the second end of at least one of the plurality of radial members 105.

The plurality of radial members 105, hubs 110, flange 120, and pressure member 130 can be fabricated from any metallic, non-metallic or composite material. Suitable metallic materials can include, but are not limited to iron and ferrous alloys including stainless steel alloys, nickel and nickel alloys, copper and copper alloys including brass and bronze alloys, and the like. Suitable non-metallic materials can include, but are not limited to, plastics, epoxies, and resin-impregnated carbon fiber laminates. Suitable composite materials can include, but are not limited to, any combination of metallic and non-metallic materials, for example a carbon fiber or plastic encapsulated steel material. In one or more specific embodiments, the plurality of radial members 105, hubs 110, flange 120, and pressure member 130 can be fabricated using a resin-impregnated carbon fiber laminate. In one or more specific embodiments, the plurality of radial members 105, hubs 110, flange 120, and pressure member 130 can be fabricated using a resin-impregnated carbon fiber laminate partially or completely encapsulated with a non-conductive polymer or plastic.

The plurality of radial members 105 can be fabricated from any material capable of producing a tensile force between the hub 110 and the flange 120 to bias the pressure member 130 in a downward direction toward the flange 120. In one or more specific embodiments, all or a portion of the plurality of radial members 105 can be a laminated resin-impregnated carbon fiber member composed of two or more plies or layers. In one or more embodiments, each ply or layer forming all or a portion of the radial member 105 can be a different material, for example one ply or layer of carbon fiber and one ply or layer of a metallic material such as spring steel. In one or more embodiments, each ply forming the radial member 105 can be a similar material, for example two or more plies or layers of resin-impregnated carbon fiber.

In one or more specific embodiments, as depicted in FIG. 1B, three resin-impregnated carbon fiber plies can be used to provide the plurality of radial members 105, hub 110, and/or flange 120. Although three plies 135, 140, and 145 are depicted in FIG. 1A, any number of plies can be similarly arranged. In one or more embodiments, the carbon fiber plies can be formed using a low modulus, standard modulus, intermediate modulus, high modulus, or ultrahigh modulus carbon fiber, having a tensile modulus of from about 35 million psi (240 million kPa) to about 145 million psi (500 million kPa). Suitable carbon fibers can include, but are not limited to, polyacrylnitril-based (PAN) carbon fiber, pitch-based carbon fiber, rayon-based carbon fibers, or combinations thereof.

In one or more embodiments, one or more other fibers, including but not limited to, glass fibers, aramid fibers, or other highly-extensible fibers, in the form of filaments, unwoven fabrics, and/or woven fabrics can be combined, mixed, laminated, or otherwise intermingled in, with, and/or between the carbon fiber plies. In one or more embodiments, one or more thermosetting resins and/or thermoplastic resins can be used to reinforce the carbon fiber. In one or more embodiments, two or more; three or more; five or more; or ten or more carbon fiber plies can be laminated or otherwise combined to form the plurality of radial members 105, hubs 110, and/or flanges 120. In one or more embodiments, the thickness of each carbon fiber ply can be the same. In one or more embodiments, the thickness of each carbon fiber ply can be or different. In one or more embodiments, the carbon fiber ply thickness can range from about 0.05 mm to about 10 mm; about 0.1 mm to about 7.5 mm; or about 0.15 mm to about 3 mm.

In one or more embodiments, the longitudinal axis of each carbon fiber ply forming the plurality of radial members 105, hubs 110, flanges 120 and/or pressure members 130 can be disposed at the same or differing angles. In one more embodiments, the interior angle formed by the longitudinal axes of adjacent carbon fiber plies forming the plurality of radial members 105, hubs 110, flanges 120 and/or pressure members 130 can range from about 15° to about 90°; about 30° to about 90°; about 45° to about 90°; or about 60° to about 90°. In one or more specific embodiments, the angle formed by the longitudinal axes of adjacent carbon fiber plies forming the plurality of radial members 105, hubs 110, flanges 120 and/or pressure members 130 can be about 90°.

Figure 2:
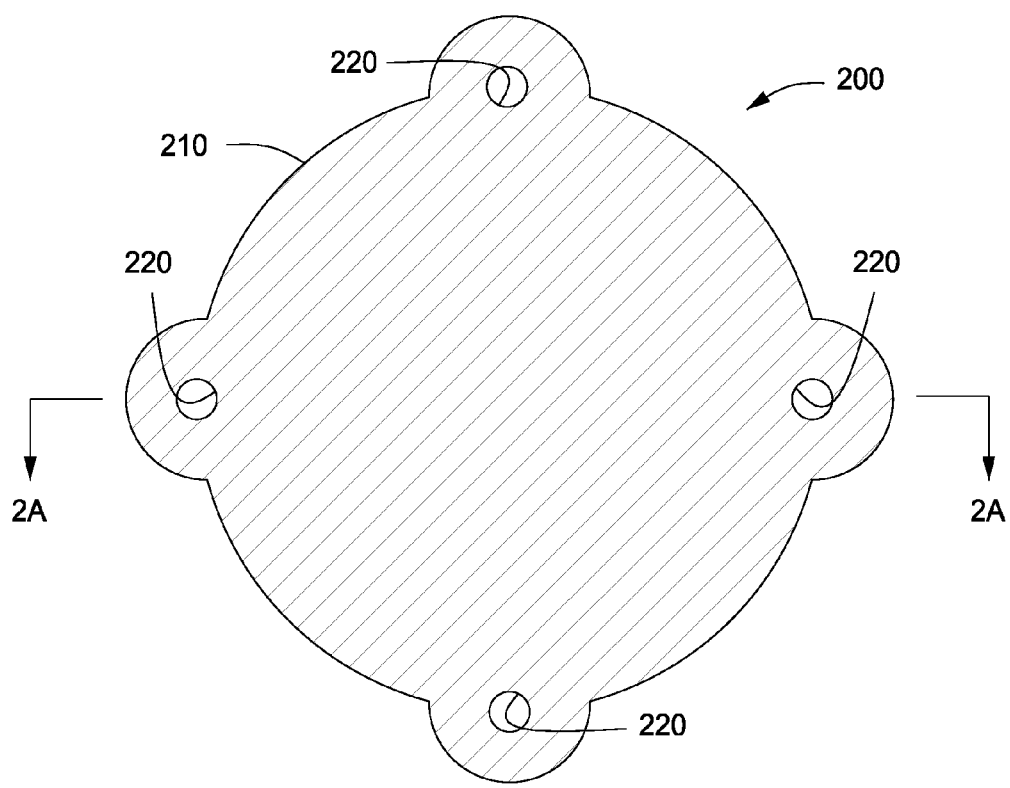
FIG. 2 depicts a plan view of an illustrative backing member, according to one or more embodiments described herein.
Figure 2A:
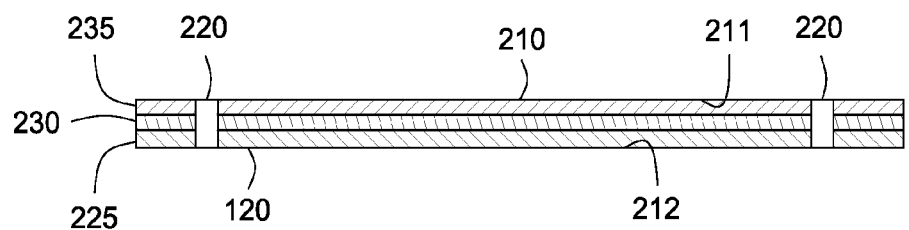
FIG. 2A depicts a cross-sectional view of the illustrative backing member depicted in FIG. 2 along line 2A-2A, according to one or more embodiments described herein.

FIG. 2 depicts a plan view of an illustrative backing member 200, according to one or more embodiments. FIG. 2A depicts a cross-sectional view of the illustrative backing member 200 depicted in FIG. 2 along line 2A-2A, according to one or more embodiments. One or more features hidden or otherwise obstructed in the plan view depicted in FIG. 2 can be more clearly depicted in the cross-sectional view depicted in FIG. 2A. In one or more embodiments, the backing member 200 can be a single or multi-piece backing member 200 having a first ("upper") surface 211 and a second ("lower") surface 212. In one or more embodiments, one or more apertures 220 can be disposed in, on, or about the backing member 200, partially or completely traversing the backing member from the upper surface 211 to the lower surface 212. In one or more embodiments, the backing member 200 can have a similar size, shape, and/or geometry to the flange 120 disposed in, on, or about the spring member 100. In one or more embodiments, although not depicted in FIG. 2 or 2A, the backing member 200 can incorporate one or more stiffening devices, for example one or more ribs, flutes, or the like.

In one or more embodiments, the one or more apertures 220 can be evenly or unevenly disposed in, on, or about the backing member 200 in any pattern, arrangement and/or frequency. Each of the one or more apertures 220 can have a constant or variable diameter. The individual apertures making up the one or more apertures 220 can have the same, or different, diameters. In one or more embodiments, two or more; four or more; six or more; or eight or more apertures 220 can be disposed in, on, or about the backing member 200. In one or more embodiments, the one or more apertures 220 can each have a diameter of from about 0.5 mm to about 10 mm; from about 1 mm to about 8 mm; or from about 1 mm to about 5 mm. In one or more specific embodiments, four (4) apertures 220, each having a diameter of from about 1 mm to about 3 mm, can be disposed evenly in, on, or about the backing member 200.

The one or more backing members 200 can be fabricated from any metallic, non-metallic, or composite material. Suitable metallic materials can include, but are not limited to iron and ferrous alloys including stainless steel alloys, copper and copper alloys including brass and bronze alloys, nickel and nickel alloys, and the like. Suitable non-metallic materials can include, but are not limited to, plastics, epoxies, and resin-impregnated carbon fiber laminates. Suitable composite materials can include, but are not limited to, any combination of metallic and non-metallic materials, for example a carbon fiber or plastic encapsulated steel material. In one or more embodiments, all or a portion of the backing member 200 can be partially or completely encapsulated with one or more non-conductive materials.

In one or more specific embodiments, the one or more backing members 200 can be fabricated using a resin-impregnated carbon fiber laminate. In one or more specific embodiments, one or more backing members 200 can be fabricated using a resin-impregnated, carbon fiber, laminate partially or completely encapsulated with a polymer or plastic shell. In one or more embodiments, the polymer or plastic shell can be electrically non-conductive.

In one or more specific embodiments, the one or more backing members 200 can be a laminated, resin-impregnated, carbon fiber, member having two or more plies or layers. In one or more embodiments, each ply or layer forming the one or more backing members 200 can be a different material, for example alternating carbon fiber and stainless steel plies. In one or more embodiments, each ply forming the one or more backing members 200 can be a similar material, for example two or more plies or layers of resin-impregnated carbon fiber.

In one or more specific embodiments, as depicted in FIG. 2A, the one or more backing members 200 can include three resin-impregnated carbon fiber plies or layers 225, 230, and 235. Although three resin-impregnated carbon fiber plies are depicted in FIG. 2A, any number of similar plies or layers can be similarly arranged to provide the required size, strength, and/or rigidity. In one or more embodiments, the carbon fiber plies can be formed using a low modulus, standard modulus, intermediate modulus, high modulus, or ultrahigh modulus carbon fiber, having a tensile modulus of from about 35 million psi (240 million kPa) to about 145 million psi (500 million kPa). The carbon fibers can include, but are not limited to, any ordinary carbon fibers such as polyacrylnitrile-based (PAN) carbon fiber, pitch-based carbon fiber, rayon-based carbon fibers, or any combination thereof.

In one or more embodiments, one or more other fibers, including but not limited to, glass fibers, aramid fibers, or other highly-extensible fibers, in the form of filaments, unwoven fabrics, and/or woven fabrics can be combined, mixed, laminated, or otherwise intermingled in, with, and/or between the carbon fiber plies. In one or more embodiments, one or more thermosetting resins and/or thermoplastic resins can be used to reinforce the carbon fiber. In one or more embodiments, two or more; three or more; five or more; or ten or more carbon fiber plies or layers can be laminated together or otherwise combined to form the one or more backing members 200. In one or more embodiments, the thickness of each carbon fiber ply or layer can be the same. In one or more embodiments, the thickness of each carbon fiber ply or layer can be or different. In one or more embodiments, the carbon fiber ply or layer thickness can range from about 0.05 mm to about 10 mm; about 0.1 mm to about 7.5 mm; or about 0.15 mm to about 3 mm.

In one or more embodiments, the longitudinal axis of the carbon fiber forming each ply or layer in the one or more backing members 200 can be disposed at differing angles. In one or more embodiments, the angle formed by the longitudinal axes of the carbon fibers in adjacent carbon fiber plies can range from about 15° to about 90°; about 30° to about 90°; about 45° to about 90°; or about 60° to about 90°. In one or more specific embodiments, the angle formed by the longitudinal axes of the carbon fibers in adjacent carbon fiber plies can range from about 80° to about 90°.

In one or more embodiments, the backing member 200 can be a rigid member such that when the spring member 100 is attached or otherwise affixed to the backing member 200, the backing member 200 experiences little or no deformation and/or deflection as a result or consequence of the tensile forces exerted on the spring member 100 and the backing member 200 by the plurality of radial members 105. By resisting deformation and/or deflection, the backing member 200 instead causes transmission of the tensile forces generated by the one or more radial members 105 to the one or more hubs 110, thereby causing a displacement of the one or more hubs 110 in a downward direction, toward the backing member 200.

Figure 3:
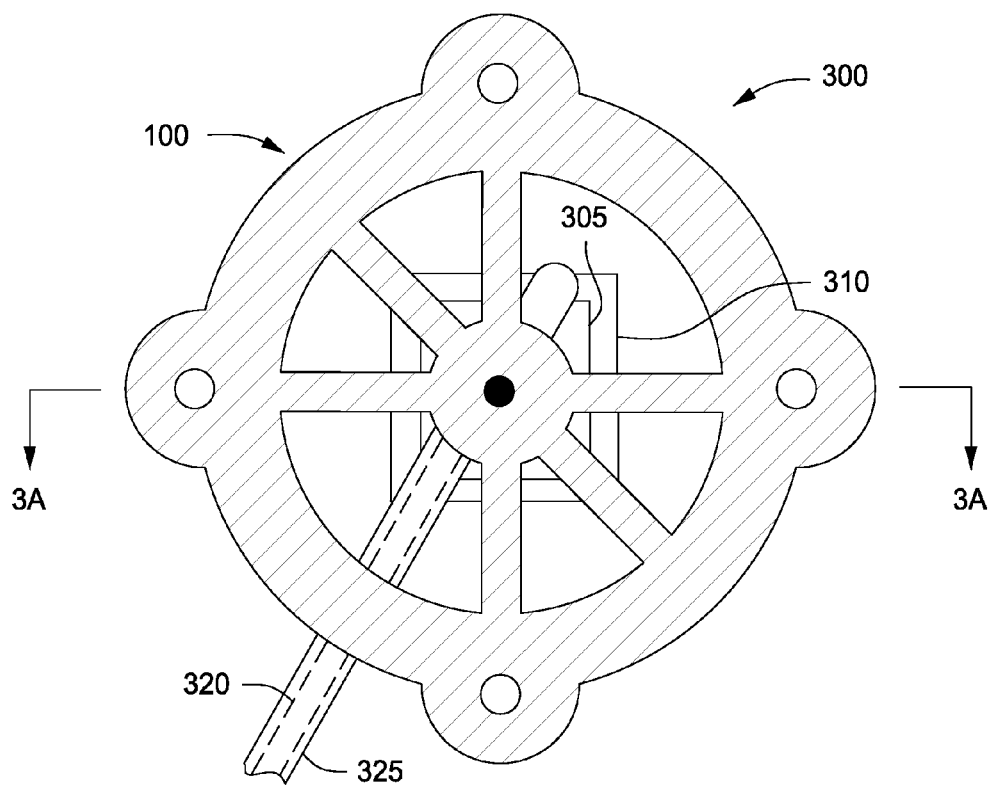
FIG. 3 depicts a plan view of an illustrative spring member securing a socket-mount device, according to one or more embodiments described herein.
Figure 3A:
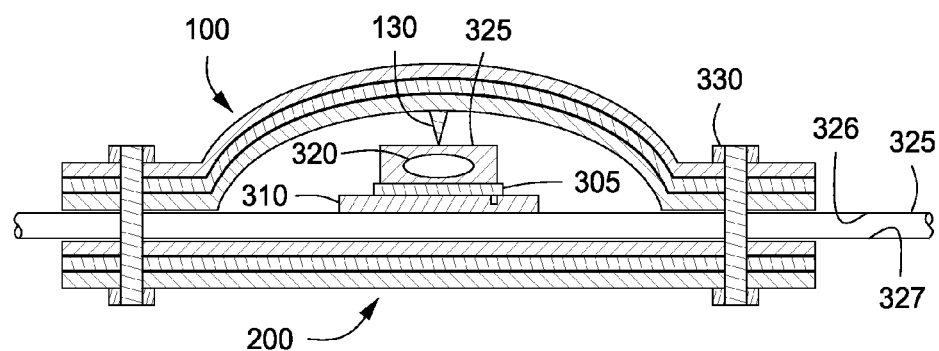
FIG. 3A depicts a cross-sectional view of an illustrative spring and backing member securing a socket-mount device depicted in FIG. 3 along line 3A-3A, according to one or more embodiments described herein.

FIG. 3 depicts a plan view of an illustrative clamping apparatus 300 securing a socket-mount device 305 in a socket 310, according to one or more embodiments. FIG. 3A depicts a cross-sectional view of the illustrative clamping apparatus 300 depicted in FIG. 3, along line 3A-3A, according to one or more embodiments. In one or more embodiments, one or more sockets 310 can be disposed in, on, or about one or more boards 325, for example one or more printed circuit boards 325. In one or more embodiments, a socket-mount device 305 can be disposed in, on, or about the one or more sockets 310 using one or more complementary attachment devices, for example one or more male pins corresponding to one or more mating female receptors.

In one or more embodiments, one or more thermal conduits 320 can be disposed proximate the socket-mount device 305 to convey all or a portion of the heat generated by the socket-mount device 305 to location remote from the socket mount device, for example from one or more central processing units ("CPUs") to one or more heat sinks in a laptop computer. In one or more embodiments, the one or more thermal conduits 320 can be disposed or otherwise encapsulated and/or embedded in one or more thermally conductive materials 325.

The socket-mount device 305 can include one or more heat generating components, for example one or more integrated circuit dies. The clamping apparatus 300 can be used to ensure the socket-mount device 305 remains connectively coupled to the socket 310. In the absence of the clamping apparatus 300, the heat generating socket-mount device 305 can progressively detach or decouple from the socket 310 due to the repeated thermal cycling of the device 305.

In one or more embodiments, the one or more boards 325 can have a first ("upper") surface 326 and a second ("lower") surface 327. One or more sockets 310 can be disposed on the upper surface 326 of the board 325. The one or more backing members 200 can be disposed proximate the lower surface 327 of the board 325, roughly proximate the location of the one or more sockets 310. After disposing the socket-mount device 305 in, on, or about the socket 310, the spring member 100 can be disposed proximate the socket-mount device 305. One or more apertures can be disposed in, on, or about the board 325, passing from the upper surface 326 to the lower surface 327 of the board 325. In one or more embodiments, the one or more apertures disposed in, on, or about the board 325 can correspond to the one or more apertures 125 disposed in, on, or about the spring member 100 and the one or more apertures 220 disposed in, on, or about the backing member 200.

In one or more embodiments, one or more fasteners 330 can be disposed or otherwise inserted in each of the one or more the one or more apertures 125 disposed in, on, or about the spring member 100. In one or more embodiments, the one or more fasteners 330 can then pass through the one or more apertures disposed in, on, or about the board 325. In one or more embodiments, the one or more fasteners can then pass through the one or more apertures 220 disposed in, on, or about the backing member 200. In such a manner, as depicted in FIGS. 3 and 3A, the one or more fasteners 330 can affix both the spring member 100 and the backing member 200 to the board 300, with the pressure member 130 trapping the socket-mount device 305 in the socket 310.

In one or more embodiments, the one or more fasteners 300 can be non-removable fasteners, for example rivets, that permanently affix the spring member 100 and the backing member 200 to the board 325. In one or more embodiments, the one or more fasteners 300 can be removable fasteners, for example screws, bolts, or similar threaded fasteners detachably attaching the spring member 100 and the backing member 200 to the board 325.

Although not depicted in FIG. 3 or 3A, in one or more embodiments, one or more tensioning and/or biasing devices or elements, for example one or more helical or coil springs can be disposed in, on, or about the one or more fasteners 300. In one or more embodiments, one or more tensioning and/or biasing devices or elements can be disposed above the spring member 100 and/or below the bottom member 200 to increase the compressive force exerted at the second end of the pressure member 130. In one or more embodiments, one or more tensioning and/or biasing devices or elements can be disposed below the spring member 100 and/or above the bottom member 200 to decrease the compressive force exerted at the second end of the pressure member 130.

In one or more embodiments, the first end of the pressure member 130 can be disposed proximate the hub 110. In one or more embodiments, the second end of the pressure member 130 can be disposed proximate one or more socket-mount devices 305. In one or more embodiments, the second end of the pressure member 130 can be disposed proximate one or more thermal conduits 320, which, in turn, can be disposed proximate one or more heat generating socket-mount devices 305. In one or more embodiments, the second end of the pressure member 130 can be disposed proximate one or more thermally conductive materials 325, encapsulating one or more thermal conduits 320, disposed proximate one or more heat generating socket-mount devices 305.

In operation, one or more fasteners 330 can be disposed within the spring member apertures 125 and the corresponding backing member apertures 220, trapping the board 325, the socket 310, the socket-mount device 305 therebetween. Increasing the compression of the one or more fasteners 330 can increase the pressure exerted by the spring member 100 on the pressure member 130, consequently increasing the pressure applied to the socket-mount device 305 trapped between the pressure member 130 and the socket 310. In one or more specific embodiments, where one or more thermal conduits 320 embedded in a thermally conductive material 325 is disposed proximate the socket-mount device 305, disposing one or more fasteners 330 within the spring member apertures 125 and the corresponding backing member apertures 220, can trap the board 325, the socket 310, the socket-mount device 305, and the one or more thermal conduits 320 embedded in a thermally conductive material 325 between the spring member 100 and the backing member 200.

Figure 4:
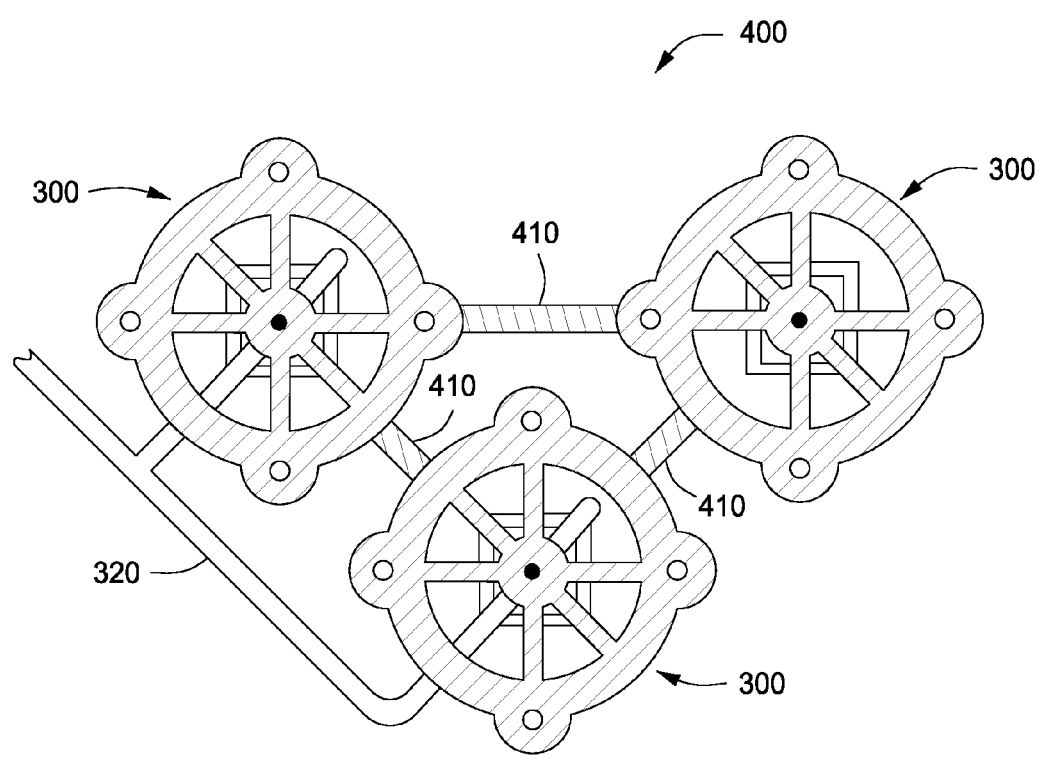
FIG. 4 depicts a plan view of a plurality of linked illustrative spring members as depicted in FIG. 3, each spring member securing a socket-mount device, according to one or more embodiments described herein.

FIG. 4 depicts a plan view of a plurality of linked illustrative spring members 300 as depicted in FIG. 3, each spring member securing a socket-mount device, according to one or more embodiments described. In one or more embodiments a plurality of sockets 310 and socket-mount devices 305 can be disposed in, on, or about can be disposed in, on, or about the upper surface 326 of the board 325. In one or more embodiments, one or more thermal conduits 320 can be disposed proximate all or a portion of the plurality of socket-mount devices 305. In one or more embodiments, although not depicted in FIG. 4 for clarity purposes, all or a portion of the one or more thermal conduits 320 can be partially or completely encapsulated using one or more thermally conductive materials 325.

In one or more embodiments, all or a portion of the plurality spring members 300 can be attached, affixed, or otherwise interconnected using one or more flex members 410. Although only one flex member 410 is depicted linking two spring members 300, any number of flex members can be similarly disposed, linking together all or a portion of the plurality of spring members 300.

In one or more embodiments, a first end of the one or more flex members 410 can be attached, bonded, integrally formed, or any combination thereof, to a first flange 120, while the second end of the one or more flex members 410 can be attached, bonded, integrally formed, or any combination thereof, to a second flange 120.

The one or more flex members 410 can be partially or completely independent of the first and second flanges 120. In one or more embodiments, the one or more flex members 410 can be a planar or semi-planar member having at least a first ("upper") surface and a second ("lower") surface. In one or more embodiments, the one or more flex members 410 can be a single-piece or a multi-piece member. In one or more embodiments, the one or more flex members 410 can be permanently or temporarily attached or otherwise affixed to the first and second flanges 120.

In one or more embodiments, the can be permanently attached or otherwise affixed to either or both the first and second flanges 120 using one or more adhesives, for example one or more thermosetting epoxy adhesives. In one or more embodiments, the one or more flex members 410 can be permanently attached or otherwise affixed to either or both the first and second flanges 120 by welding, soldering, or the like. In one or more embodiments, the one or more flex members 410 can be detachably attached to either or both the first and second flanges 120 using one or more mechanical fasteners, for example one or more rivets, screws, or the like.

In one or more embodiments, all or a portion of the one or more flex members 410 can be integrally fabricated, permanently joined, or otherwise unified with. In one or more embodiments, all or a portion of the one or more flex members 410 can be integrally cast or forged with either or both the first and second flanges 120. In one or more embodiments, all or a portion of the one or more flex members 410 can be a laminated structure integrally shaped, laid, or molded with either or both the first and second flanges 120.

Certain embodiments and features have been described using a set of numerical upper limits and a set of numerical lower limits. It should be appreciated that ranges from any lower limit to any upper limit are contemplated unless otherwise indicated. Certain lower limits, upper limits and ranges appear in one or more claims below. All numerical values are "about" or "approximately" the indicated value, and take into account experimental error and variations that would be expected by a person having ordinary skill in the art.

Various terms have been defined above. To the extent a term used in a claim is not defined above, it should be given the broadest definition persons in the pertinent art have given that term as reflected in at least one printed publication or issued patent. Furthermore, all patents, test procedures, and other documents cited in this application are fully incorporated by reference to the extent such disclosure is not inconsistent with this application and for all jurisdictions in which such incorporation is permitted.

While the foregoing is directed to embodiments of the present invention, other and further embodiments of the invention may be devised without departing from the basic scope thereof, and the scope thereof is determined by the claims that follow.

What is claimed is:

1. A clamping apparatus comprising:
   a backing member having a plurality of apertures disposed therethrough;
   a spring member comprising:
      a plurality of radial members, each radial member having a first end and a second end, wherein the plurality of radial members produce a biasing force of the spring member and comprise at least two plies of resin-impregnated carbon fiber;
      a hub, connecting all or a portion of the first end of two or more radial members;
      a pressure member extending from the hub and having a first end and a second end, the first end disposed proximate the hub; and
      a flange, connecting all or a portion of the second end of two or more radial members, the flange having a plurality of apertures disposed therethrough, a location of each flange aperture corresponding to a location of each backing member aperture; and
   a plurality of fasteners disposed through the backing member apertures and the corresponding flange apertures, rigidly affixing the spring member to the backing member,
   wherein the radial members extend between the hub and the flange, and the hub transmits the biasing force of the radial members to the pressure member to bias the second end of the pressure member toward the backing member.

2. The apparatus of claim 1:
   wherein a first carbon fiber ply forming the plurality of radial members comprises carbon fibers principally oriented along a first axis;
   wherein a second carbon fiber ply forming the plurality of radial members comprises carbon fibers principally oriented along a second axis;
   wherein the first carbon fiber ply and the second carbon fiber ply are bonded together; and
   wherein the first axis and the second axis are disposed at an angle of from about 60° to about 90°.

3. The apparatus of claim 1:
   wherein the backing member comprises at least two plies of resin-impregnated carbon fiber;
   wherein a first carbon fiber ply comprises carbon fibers principally oriented along a first axis;
   wherein a second carbon fiber ply comprises carbon fibers principally oriented along a second axis;
   wherein the first carbon fiber ply and the second carbon fiber ply are bonded together; and
   wherein the first axis and the second axis are disposed at an angle of from about 60° to about 90°.

4. The apparatus of claim 1:
   wherein the hub, pressure member, and flange comprise at least two plies of resin-impregnated carbon fiber;
   wherein a first carbon fiber ply comprises carbon fibers principally oriented along a first axis;
   wherein a second carbon fiber ply comprises carbon fibers principally oriented along a second axis;
   wherein the first carbon fiber ply and the second carbon fiber ply are bonded together; and
   wherein the first axis and the second axis are disposed at an angle of from about 60° to about 90°.

5. The apparatus of claim 1, wherein at least a portion of the spring member is encapsulated in a non-conductive material.

6. The apparatus of claim 1, wherein at least a portion of the backing member is encapsulated in a non-conductive material.

7. The apparatus of claim 1, wherein the backing member comprises one or more planar segments.

8. A method for affixing a socket-mount device, comprising:
   disposing a spring member proximate a first side of a board having one or more socket-mount devices disposed thereupon, the spring member comprising:
      a plurality of radial members, each member having a first end and a second end, wherein the plurality of radial members produce a biasing force of the spring member and comprise at least two plies of resin-impregnated carbon fiber;
      a hub, connecting all or a portion of the first end of each radial member;
      a pressure member extending from the hub and having a first end and a second end, the first end disposed proximate the hub, wherein the second end of the pressure member is disposed proximate at least one of the one or more socket-mount devices; and
      a flange, connecting all or a portion of the second end of each radial member, the flange having a plurality of apertures disposed therethrough;
   disposing proximate a second side of the board a backing member having a plurality of apertures therethrough, wherein the plurality of apertures of the backing member correspond to the plurality of apertures of the flange;
   affixing the spring member to the backing member using one or more fasteners disposed in one or more of the corresponding apertures through the backing member and the flange,
   wherein the radial members extend between the hub and the flange, and the hub transmits the biasing force of the radial members to the pressure member to bias the second end of the pressure member toward the backing member.

9. The method of claim 8:
   wherein a first carbon fiber ply forming the plurality of radial members comprises carbon fibers principally oriented along a first axis;

wherein a second carbon fiber ply forming the plurality of radial members comprises carbon fibers principally oriented along a second axis;

wherein the first carbon fiber ply and the second carbon fiber ply are bonded together; and wherein the first axis and the second axis are disposed at an angle of from about 60° to about 90°.

10. The method of claim 8, wherein the backing member comprises at least two plies of resin-impregnated carbon fiber;

wherein a first carbon fiber ply comprises carbon fibers principally oriented along a first axis;

wherein a second carbon fiber ply comprises carbon fibers principally oriented along a second axis;

wherein the first carbon fiber ply and the second carbon fiber ply are bonded together; and wherein the first axis and the second axis are disposed at an angle of from about 25° to about 90°.

11. The apparatus of claim 8:

wherein the hub, pressure member, and flange comprise at least two plies of resin-impregnated carbon fiber;

wherein a first carbon fiber ply comprises carbon fibers principally oriented along a first axis;

wherein a second carbon fiber ply comprises carbon fibers principally oriented along a second axis;

wherein the first carbon fiber ply and the second carbon fiber ply are bonded together; and wherein the first axis and the second axis are disposed at an angle of from about 60° to about 90°.

12. The method of claim 8, further comprising one or more flex members disposed in, on, or about the flange of the spring member.

13. The method of claim 10, wherein the flex member comprises at least two plies of resin-impregnated carbon fiber;

wherein a first carbon fiber ply comprises carbon fibers principally oriented along a first axis;

wherein a second carbon fiber ply comprises carbon fibers principally oriented along a second axis;

wherein the first carbon fiber ply and the second carbon fiber ply are bonded together; and wherein the first axis and the second axis are disposed at an angle of from about 25° to about 90°.

14. A clamping apparatus comprising:

a backing member;

a spring member including a hub, a flange spaced radially from the hub, a pressure member extended axially from the hub, and a plurality of radial members extended between the hub and the flange; and a plurality of fasteners extended through apertures of the backing member and corresponding apertures of the flange to affix the spring member to the backing member, the radial members comprising resin-impregnated carbon fiber, and the radial members to bias the hub and the pressure member toward the backing member.

15. The apparatus of claim 14, wherein the radial members comprise arched members extended radially between the hub and the flange.

16. The apparatus of claim 14, wherein the hub and the flange comprise resin-impregnated carbon fiber.

17. The apparatus of claim 14, wherein at least a portion of the spring member is encapsulated in a non-conductive material.

* * * * *